(12) United States Patent
Ikeda et al.

(10) Patent No.: US 11,037,870 B2
(45) Date of Patent: Jun. 15, 2021

(54) ELECTRONIC MODULE, LEAD FRAME AND MANUFACTURING METHOD FOR ELECTRONIC MODULE

(71) Applicant: SHINDENGEN ELECTRIC MANUFACTURING CO., LTD., Tokyo (JP)

(72) Inventors: Kosuke Ikeda, Hanno (JP); Osamu Matsuzaki, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 394 days.

(21) Appl. No.: 16/070,267

(22) PCT Filed: May 19, 2017

(86) PCT No.: PCT/JP2017/018826
§ 371 (c)(1),
(2) Date: Jul. 13, 2018

(87) PCT Pub. No.: WO2018/211684
PCT Pub. Date: Nov. 22, 2018

(65) Prior Publication Data
US 2021/0043554 A1    Feb. 11, 2021

(51) Int. Cl.
*H01L 23/498*    (2006.01)
*H01L 21/48*    (2006.01)
(Continued)

(52) U.S. Cl.
CPC .... *H01L 23/49833* (2013.01); *H01L 21/4842* (2013.01); *H01L 21/4853* (2013.01);
(Continued)

(58) Field of Classification Search
CPC .......... H01L 23/49833; H01L 23/3107; H01L 23/367; H01L 23/49555; H01L 23/49811;
(Continued)

(56) References Cited

U.S. PATENT DOCUMENTS 5,218,231 A    6/1993  Kudo
2007/0228534 A1  10/2007  Uno et al.
(Continued)

FOREIGN PATENT DOCUMENTS

CN    103534805 A    8/2016
JP    H06026280 U    4/1994
(Continued)

OTHER PUBLICATIONS

Office action and search report from TW app. No. 107116765, dated Jul. 16, 2019, with English translation from Google Translate.
(Continued)

*Primary Examiner* — Seahvosh Nikmanesh
(74) *Attorney, Agent, or Firm* — Ladas & Parry, LLP

(57) ABSTRACT

An electronic module has a first substrate 11, a first electronic element 13, a second electronic element 23, a second substrate 21, a first terminal part 110 and a second terminal part 120. The first terminal part 110 has a first terminal base end part 111, a first terminal outer part 113, and a first bending part 112 that is provided between the first terminal base end part 111 and the first terminal outer part 113 and that is bent toward the other side on a side of the first terminal base end part 111. The second terminal part 120 has a second terminal base end part 121, a second terminal outer part 123, and a second bending part 122 that is provided between the second terminal base end part 121 and the second terminal outer part 123 and that is bent toward one side on a side of the second terminal base end part 121.

12 Claims, 13 Drawing Sheets

(51) Int. Cl.
    *H01L 23/31*     (2006.01)
    *H01L 23/367*     (2006.01)
    *H01L 23/495*     (2006.01)
    *H01L 23/00*     (2006.01)
    *H01L 25/07*     (2006.01)
    *H01L 25/18*     (2006.01)
    *H01L 25/00*     (2006.01)

(52) U.S. Cl.
    CPC ........ *H01L 23/3107* (2013.01); *H01L 23/367* (2013.01); *H01L 23/49555* (2013.01); *H01L 23/49811* (2013.01); *H01L 24/32* (2013.01); *H01L 24/33* (2013.01); *H01L 25/074* (2013.01); *H01L 25/18* (2013.01); *H01L 25/50* (2013.01); *H01L 2224/32225* (2013.01); *H01L 2224/32245* (2013.01); *H01L 2224/33181* (2013.01)

(58) Field of Classification Search
    CPC . H01L 21/4842; H01L 21/4853; H01L 24/32; H01L 24/33; H01L 25/18; H01L 25/50
    See application file for complete search history.

(56) References Cited

U.S. PATENT DOCUMENTS

2012/0074516 A1     3/2012     Yamaguchi et al.
2014/0197525 A1     7/2014     Kadoguchi et al.
2017/0345742 A1*     11/2017     Sakamoto ........... H01L 23/4952
2019/0371703 A1*     12/2019     Matsuzaki ............. H01L 24/92

FOREIGN PATENT DOCUMENTS

| JP | H09232499 A | 9/1997 |
|---|---|---|
| JP | 2001156225 A | 6/2001 |
| JP | 2008016469 A | 1/2008 |
| JP | 2010016947 A | 1/2010 |
| JP | 2014045157 A | 3/2014 |
| JP | 2015050340 A | 3/2015 |
| JP | 2015060844 A | 3/2015 |
| JP | 2016066700 A | 4/2016 |
| WO | 2012157069 A1 | 11/2012 |

OTHER PUBLICATIONS

International Search Report for PCT/JP2017/018826 dated May 31, 2017 and its English translation from Google Translate.
Written Opinion of the International Searching Authority for PCT/JP2017/018826 dated May 31, 2017 and its English translation from Google Translate.
International Preliminary Report on Patentability for PCT/JP2017/018826 dated Jun. 13, 2018 and its English translation from Google Translate.
Netherlands, App. No. 2020940, Search Report, dated Feb. 20, 2019.

* cited by examiner

FIG.9
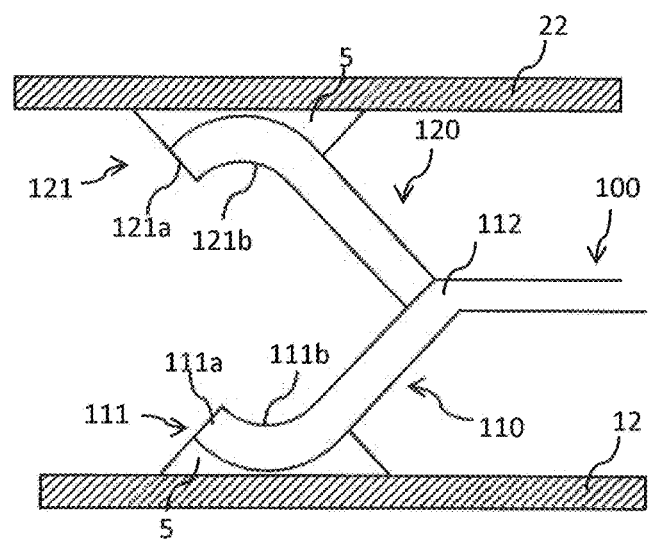
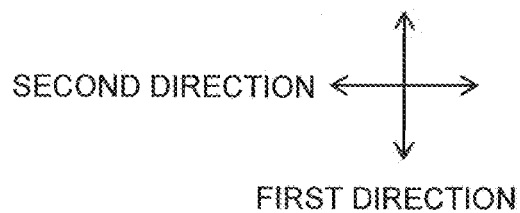

FIG.10
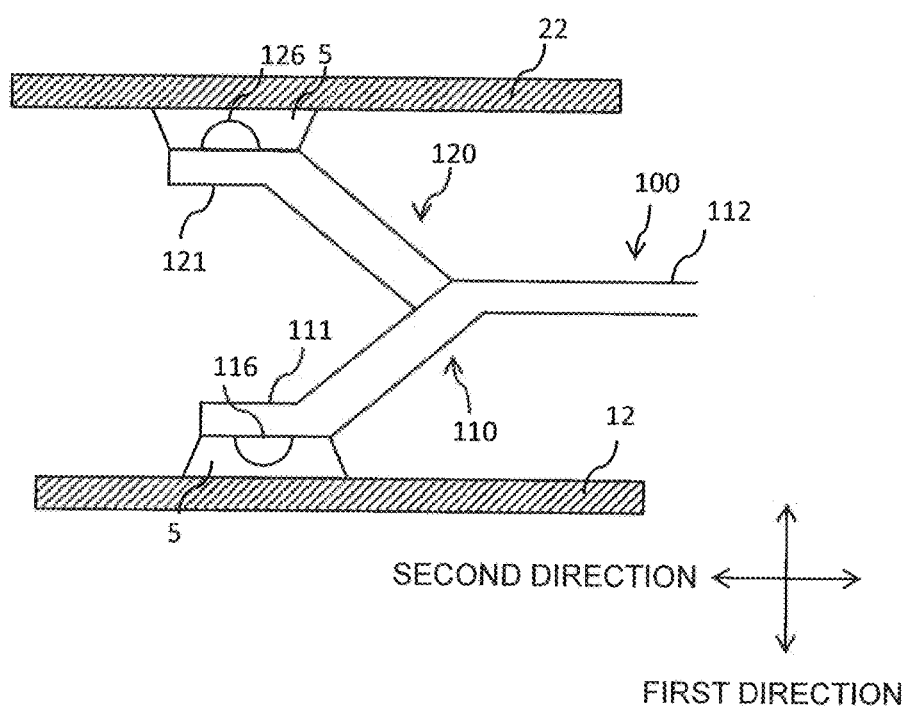
(a)
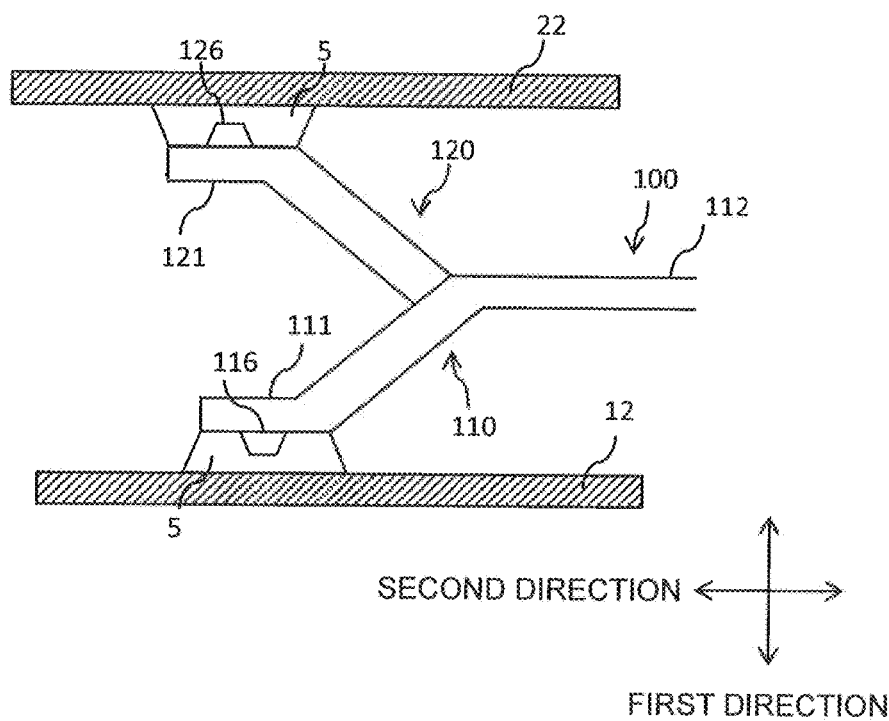
(b)

FIG.12
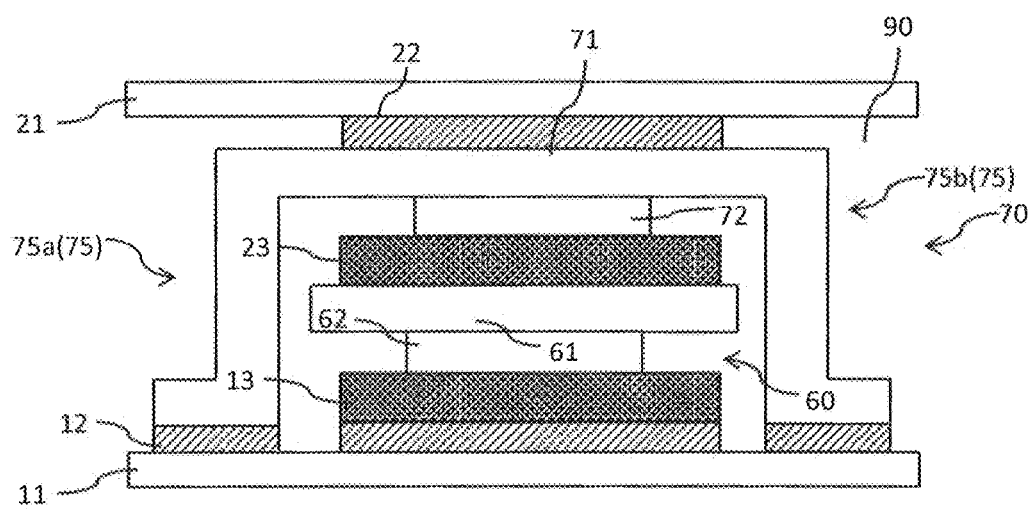

ELECTRONIC MODULE, LEAD FRAME AND MANUFACTURING METHOD FOR ELECTRONIC MODULE

CROSS-REFERENCE TO RELATED APPLICATION

The present application is the U.S. national phase of PCT Application PCT/JP2017/018826 filed on May 19, 2017, the disclosure of which is incorporated herein by reference in its entirety.

TECHNICAL FIELD

The present invention relates to an electronic module, a lead frame, and an electronic module.

BACKGROUND ART

An electronic module is conventionally known in which a plurality of electronic elements are provided in a sealing resin (see, for example, JP 2014-45157 A). It is requested that the size of the electronic module described above be reduced.

As one example of a means for reducing the size of the electronic module described above, it is conceivable to employ an aspect in which the plurality of electronic elements are stacked in layers. In this case, it is conceivable to provide one electronic element (a second electronic element) on one side (for example, on a front surface side) of another electronic element (a first electronic element).

Even when the aspect described above is employed, in a case where an aspect is employed in which a terminal that is electrically connected to the second electronic element is connected so as to be lowered to a first conductor layer provided on a first substrate, the size in a planar direction of the electronic module increases. When the size of the first substrate and the size of a second substrate increase, as described above, the first substrate and the second substrate may be warped or distorted in a heat treatment process such as a soldering process or a reflow process.

SUMMARY OF INVENTION

Technical Problem

The present invention provides an electronic module, lead frame, and a manufacturing method for the electronic module that can prevent an increase in size in a planar direction such that a warp or a distortion can be prevented from being generated in the first substrate and the second substrate.

Solution to Problem

An electronic module according to the present invention may comprise:
a first substrate;
a first electronic element that is provided on one side of the first substrate;
a second electronic element that is provided on ore side of the first electronic element;
a second substrate that is provided on one side of the second electronic element;
a first terminal part that is electrically connected to the first electronic element; and
a second terminal part that is electrically connected to the second electronic element, wherein
the first terminal part has a first terminal base end part, a first terminal outer part, and a first bending part that is provided between the first terminal base end part and the first terminal outer part and that is bent toward the other side on a side of the first terminal base end part, and
the second terminal part has a second terminal base end part, a second terminal outer part, and a second bending part that is provided between the second terminal base end part and the second terminal outer part and that is bent toward one side on a side of the second terminal base end part.

The electronic module, according to the present invention, may further comprise a sealing part that seals at least the first electronic element, the second electronic element, the first terminal base end part, the first bending part, the second terminal base end part and the second bending part, and
wherein at a boundary between the sealing part and an outside, a distance in a thickness direction between the first terminal outer part and the first substrate corresponds to a distance in the thickness direction between the second terminal outer part and the second substrate.

The electronic module, according to the present invention, may further comprise a sealing part that seals at least the first electronic element, the second electronic element, the first terminal base end part, the first bending part, the second terminal base end part and the second bending part, and wherein
at a boundary between the sealing part and an outside, a distance in a thickness direction between the first terminal outer part and the first substrate corresponds to a distance in the thickness direction between the first terminal outer part and the second substrate, and at the boundary between the sealing part and the outside, a distance in the thickness direction between the second terminal outer part and the first substrate corresponds to a distance in the thickness direction between the second terminal outer part and the second substrate.

In the electronic module according to the present invention,
the first terminal base end part has a first separated part, a distance from the first substrate in a thickness direction of which increases on a side of a base end part, and
the second terminal base end part has a second separated part, a distance from the second substrate in the thickness direction of which increases on a side of a base end part.

In the electronic module according to the present invention,
the first terminal base end part has a first bent part, and the first separated part is formed on a side of a base end part of the first bent part, and
the second terminal base end part has a second bent part, and the second separated part is formed on a side of a base end part of the second bent part.

In the electronic module according to the present invention,
the first bent part has an angular shape or an arc shape in a longitudinal cross section, and
the second bent part has an angular shape or an arc shape in a longitudinal cross section.

In the electronic module according to the present invention,
the first terminal base end part has a first terminal protrusion part that protrudes on a side of the first substrate and
the second terminal base end part has a second terminal protrusion part that protrudes on a side of the second substrate.

A lead frame according to the present invention may comprise a first terminal part having a first terminal base end part, a first terminal outer part, and a first bending part that is provided between the first terminal base end part and the first terminal outer part and that is bent toward the other side on a side of the first terminal base end part;

a second terminal part having a second terminal base end part, a second terminal outer part, and a second bending part that is provided between the second terminal base end part and the second terminal outer part and that is bent toward one side on a side of the second terminal base end part; and a coupling body connecting between the first terminal part and the second terminal part.

A manufacturing method for an electronic module according to the present invention may comprise:

a step of causing the first terminal base end part of the lead frame according to claim 8 to abut onto a first conductor layer provided on a first substrate or a first substrate that is a metal substrate, and causing the second terminal base end part of the lead frame according to claim 8 to abut onto a second conductor layer provided on a second substrate or a second substrate that is a metal substrate; and a step of cutting off the coupling body, wherein the first conductor layer or the first substrate that is the metal substrate is electrically connected to a first electronic element, and the second conductor layer or the second substrate that is the metal substrate is electrically connected to a second electrons element.

Advantageous Effects of Invention

As an aspect of the present invention, when an aspect is employed in which the first terminal part has the first bending part and the first terminal base end part connected to the first conductor layer and the second terminal part has the second bending part and the second terminal base end part connected to the second conductor layer, both the first conductor layer provided on the first substrate and the second conductor layer provided on the second substrate can be used, Consequently, a circuit pattern can be formed using both the first substrate and the second substrate, a size in the planar direction can be prevented from increasing, and a warp or a distortion can be prevented from being generated in the first substrate and the second substrate.

BRIEF DESCRIPTION OF DRAWINGS

FIG. 8 is a longitudinal sectional view of another example of a terminal part that may be used in the second embodiment of the present invention.

FIG. 10(*a*) is a longitudinal sectional view of a terminal part that may be used in a third embodiment of the present invention, and FIG. 10(*b*) is a longitudinal sectional view of another example of the terminal part that may be used in the third embodiment of the present invention.

FIG. 12 is a longitudinal sectional view of an electronic module that may be used in a fifth embodiment of the present invention.

DESCRIPTION OF EMBODIMENTS

First Embodiment

Configuration

Figure 1:
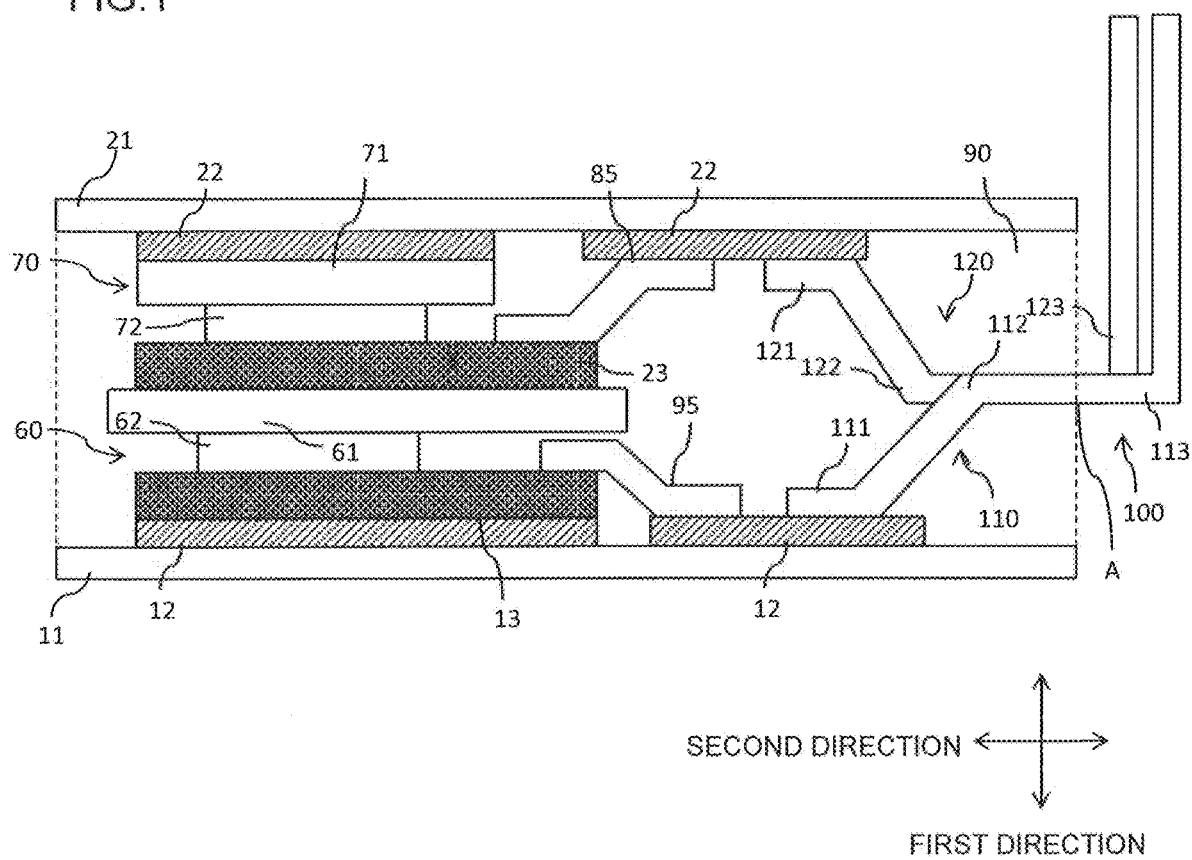
FIG. 1 is a longitudinal sectional view of an electronic module that may be used in a first embodiment the present invention.

In this embodiment, "one side" means an upper side in FIG. 1, and "the other side" means a lower side in FIG. 1. In FIG. 1, a vertical direction is referred to as a "first direction", a horizontal direction is referred to as a "second direction", and directions of the front and rear sides of paper are referred to as a "third direction". An in-plane direction including the second direction and the third direction is referred to as a "planar direction", and a view from one side is referred to as a "plan view".

An electronic module according to this embodiment may have a first electronic unit and a second electronic unit.

As illustrated in FIG. 1, the first electronic unit may have a first substrate 11, a plurality of first conductor layers 12 that are provided on one side of the first substrate 11, and a first electronic element 13 that is provided on one side of the first conductor layer 12. The first electronic element 13 may be a switching element, or may be a control element. When the first electronic element 13 is a switching element, the first electronic element 13 may be a'MOSFET, an IGBT, or the like, Each of the first electronic element 13 and the second electronic element 23 described later may be configured by a semiconductor element, and a semiconductor material may be silicon, silicon carbide, gallium nitride, or the like. A surface on the other side of the first electronic element 13 may be connected to the first conductor layer 12 via a conductive adhesive 5 (see FIGS. 9 and 10) such as solder. The conductive adhesive 5 is not illustrated in drawings such as FIG. 1 or FIG. 5 in order to simplify display.

A first connection body 60 may be provided on one side of the first electronic element 13. The first connection body 60 may be connected to a surface on one side of the first electronic element 13 via the conductive adhesive 5 such as solder.

As illustrated in FIG. 1, a second electronic unit may be provided on one side of the first connection body 60. The second electronic unit may have a second electronic element 23 that is provided on one side of the first connection body 60. The second electronic unit may have a second substrate 21 and second conductor layers 22 that are provided on the other side of the second substrate 21. A second connection body 70 may be provided on the other side of the second conductor layer 22. The second connection body 70 may be connected to a surface on one side of the second electronic element 23 and a surface on the other side of the second conductor layer 22 via the conductive adhesive 5 such as solder.

The second electronic element 23 may be a switching element, or may be a control element. When the second electronic element 23 is a switching element, the second electronic element 23 may be a MOSFET, an IGBT, or the like.

The first connection body 60 may have a first head 61 and a first column 62 that extends toward the other side from the first head 61. The second connection body 70 may have a second head 71 and a second column 72 that extends toward the other side from the second head 71. The first connection body 60 may have a substantially T-shaped cross section, and the second connection body 70 may also have a substantially T-shaped cross section.

As the first substrate 11 and the second substrate 21, a ceramic substrate, an insulating resin layer, or the like can be employed. As the conductive adhesive 5, solder, an Ag-based material, or a Cu-based material can be used. As the material of the first connection body 60 and the second connection body 70, metal such as Cu can be used. As the substrates 11 and 12 that are respectively provided with the conductor layers 12 and 22, a metal substrate on which a circuit pattern is formed can also be used. In a case where the metal substrate on which the circuit pattern is formed can also be used, for example, as the substrates 11 and 21, the substrates 11 and 21 also serve as the conductor layers 12 and 22.

The electronic module may have a sealing part 90 that is configured by a sealing resin or the like that seals, for example, the first electronic element 13, the second electronic element 23, the first connection body 60, the second connection body 70, the first conductor layer 12, and the second conductor layer 22 that are described above.

The first conductor layer 12 may be connected to a terminal part 100, and an end side of the terminal part 100 may be exposed in an outward direction of the sealing part 90 so as to be connectable to an external device.

The terminal part 100 may have a first terminal part 110 that has a first bending part 112 that is bent toward the other side, and a second terminal part 120 that has a second bending part 122 that is bent toward one side.

More specifically, the first terminal part 110 may have a first terminal base end part 111 that is connected to the first conductor layer 12, a first terminal outer part 113 that is exposed in an outward direction of the sealing part 90, and the first bending part 112 that is provided between the first terminal base end part 111 and the first terminal outer part 113 and that is bent toward the other side on a side of the first terminal base end part 111. The first terminal base end part 111 may be connected to a surface on one side of the first conductor layer 12 via the conductive adhesive 5.

The second terminal part 120 may have a second terminal base end part 121 that is connected to the second conductor layer 22, a second terminal outer part 123 that is exposed in an outward direction of the sealing part 90, and a second bending part 122 that is provided between the second terminal base end part 121 and the second terminal outer part 123 and that is bent toward one side on a side of the second terminal base end part 121. The second terminal base end part 121 may be connected to a surface on the other side of the second conductor layer 22 via the conductive adhesive 5.

Figure 3:
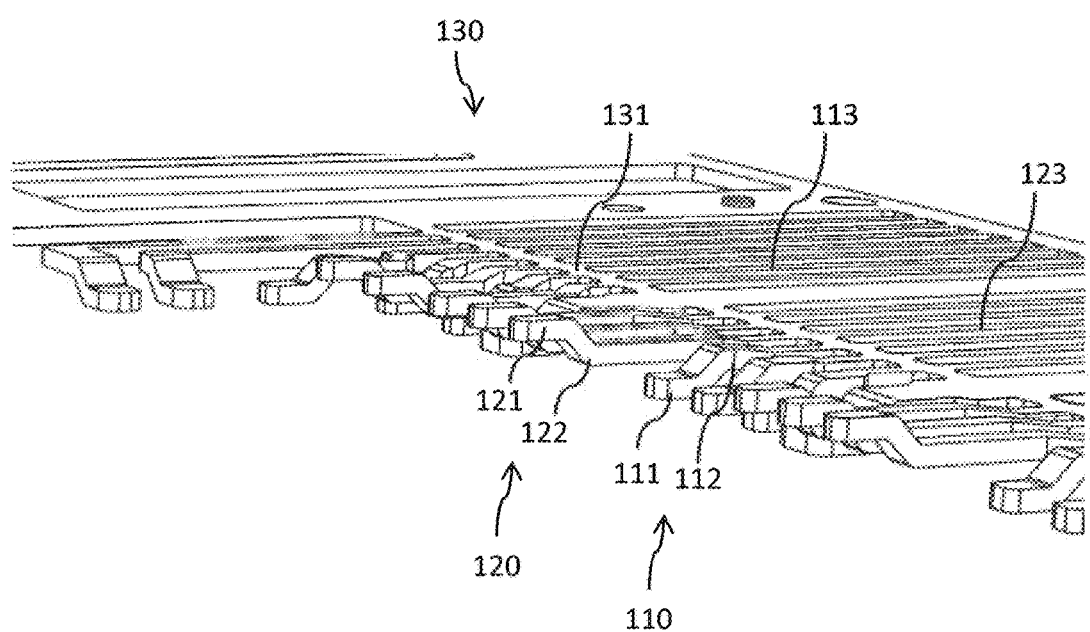
FIG. 3 is a perspective view of a lead frame that may be used in the first embodiment of the present invention.
Figure 4:
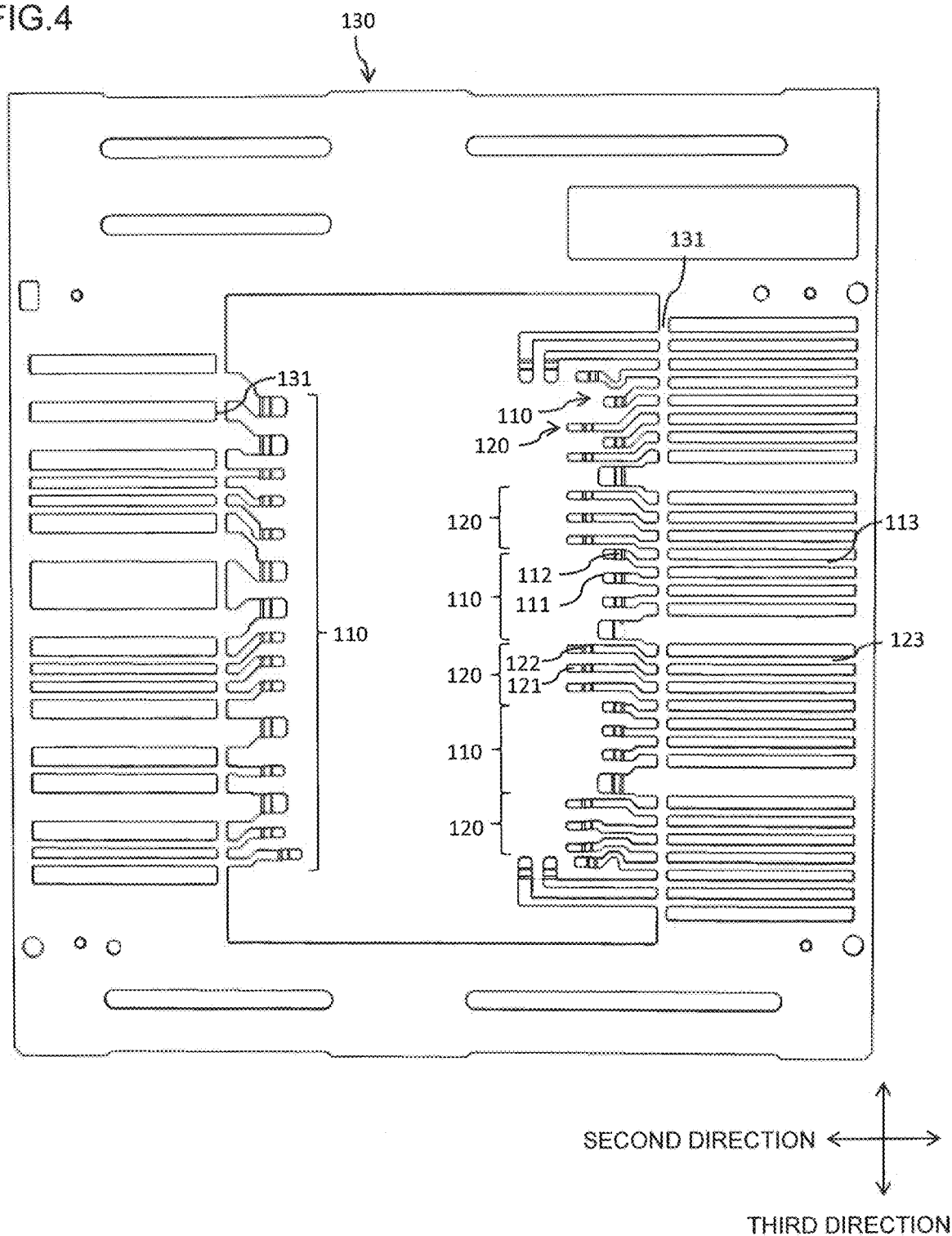
FIG. 4 is a plan view of the lead frame that may be used in the first embodiment of the present invention.

The first terminal part 110 and the second terminal part 120 may be attached using a lead frame 130 illustrated in FIGS. 3 and 4. The lead frame 130 has a configuration that corresponds to the terminal part 100 described above. More specifically, the lead frame 130 according to this embodiment has a first terminal part 110 and a second terminal part 120. The first terminal part 110 has a first terminal base end part 111 that is provided on a circumferential inner side, a first terminal outer part 113 that is provided on a circumferential outer side, and a first bending part 112 that is provided between the first terminal base end part 111 and the first terminal outer part 113 and that is bent toward the other side n a side of the first terminal base end part 111. The second terminal part 120 has a second terminal base end part 121 that is provided on the circumferential inner side, a second terminal outer part 123 that is provided on the circumferential outer side, and a second bending part 122 that is provided between the second terminal base end part 121 and the second terminal outer part 123 and that is bent toward one side on a side of the second terminal base end part 121. The first terminal part 110 and the second terminal part 120 are mutually coupled by a coupling body 131, and a manufacturing process may be employed in which the coupling body 131 is cut off after the first terminal base end part 111 is coupled to the first conductor layer 12 via the conductive adhesive 5 and the second terminal base end part 121 is coupled to the second conductor layer 22 via the conductive adhesive 5, The material of the lead frame 130 may be metal such as Cu.

The positions in the second direction of the first bending part 112 and the second bending part 122 may deviate from each other, as illustrated in FIG. 1, or may match each other, as described later in a second embodiment and the like. The first terminal outer part 113 and the second terminal outer part 123 may be bent on their end sides, as illustrated in FIG. 1, or may not be bent in contrast to this aspect. When the first terminal outer part 113 and the second terminal outer part 123 are bent on their end sides, as illustrated in FIG. 1, the positions in the second direction of ends may deviate from each other, as illustrated in FIG. 1, or may match each other in contrast to this aspect.

As illustrated in FIG. 4, only the first terminal parts 110 may be provided on one side of the lead frame 130 (on a left-hand side in FIG. 4), and both the first terminal parts 110 and the second terminal parts 120 may be provided on another side of the lead frame 130 (on a right-hand side in FIG. 4), In addition, as illustrated on the other side of the lead frame 130 in FIG. 4, every prescribed number (1 to 4) of the first terminal parts 110 and every prescribed number (1 to 4) of the second terminal parts 120 may be disposed in such a way that the first terminal parts 110 are nested into the second terminal parts 120.

The height (the length in the first direction) of the load frame 130 may be greater than or equal to a design height (a space in the first direction) between the first substrate 11 and the second substrate 21. When the aspect described above is employed, there is an advantage wherein the lead frame 130 can apply a force (an elastic force) that separates the first substrate 11 from the second substrate 21 and this results in a reduction in an influence of a warp or a distortion of the first substrate 11 or the second substrate 21. When the sealing resin serving as the sealing part 90 is injected into a mold, the first substrate 11 and the second substrate 21 are pressed from one side by the mold. Therefore, even when the height (the length in the first direction) of the lead frame 130 is greater than a design height (a space in the first direction)

between the first substrate 11 and the second substrate 21, a space between the first substrate 11 and the second substrate 21 has a designed distance.

At a boundary A (see FIG. 1) between the sealing part 90 and the outside, a distance in a thickness direction (a distance in the first direction) between the first terminal outer part 113 and the first substrate 11 may correspond to a distance in the thickness direction between the second terminal outer part 123 and the second substrate 21, In this embodiment, that a distance "corresponds" to another distance means that these distances are within a range of ±5% from a mean value. Stated another way, when it is assumed that the distance in the thickness direction between the first terminal outer part 113 and the first substrate 11 is "L1", the distance in the thickness direction between the second terminal outer part 123 and the second substrate 21 is "L2", and a mean value of the distance in the thickness direction between the first terminal outer part 113 and the first substrate 11 and the distance in the thickness direction between the second terminal outer part 123 and the second substrate 21 is "La", that the distance in the thickness direction between the first terminal outer part 113 and the first substrate 11 corresponds to the distance in the thickness direction between the second terminal outer part 123 and the second substrate 21 means that 1.05× La≥L1≥0.95× La.

At the boundary A between the sealing part 90 and the outside, the distance in the thickness direction between the first terminal outer part 113 and the first substrate 11 may correspond to a distance in the thickness direction between the first terminal outer part 113 and the second substrate 21. In addition, a distance in the thickness direction between the second terminal outer part 123 and the first substrate 11 may correspond to the distance in the thickness direction between the second terminal outer part 123 and the second substrate 21, Also in this case, "correspond" has the meaning described above.

The first terminal base end Part 111 does not always need to have a linear shape that extends in the planar direction, and may be inclined with respect to the planar direction. Similarly, the second terminal base end part 121 does not always need to have a linear shape that extends in the planar direction, and may be inclined with respect to the planar direction.

Figure 2:
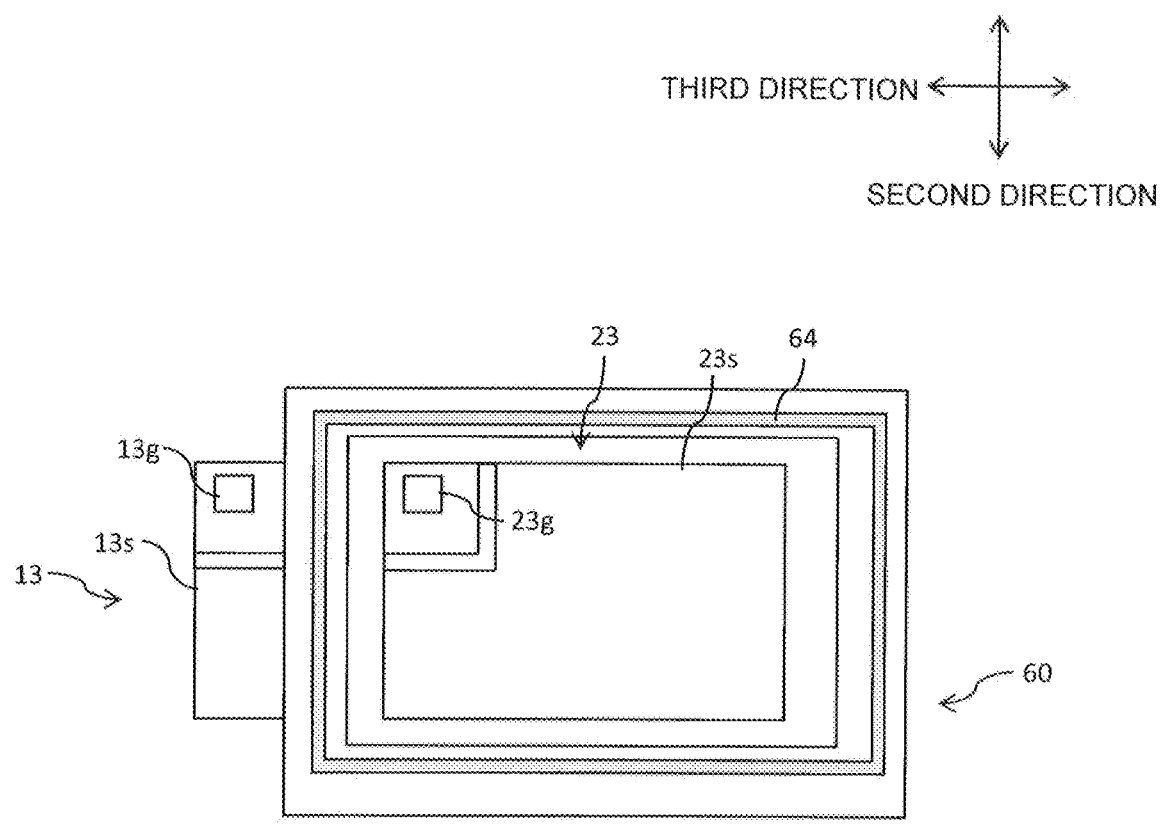
FIG. 2 is a plan view of the electronic module that may be used in the first embodiment of the present invention.

As illustrated in FIG. 2, a first groove 64 may be provided on a surface on one side of the first head 61. In the plan view (in the planar direction), the first groove 64 is provided on a circumferential outer side of the first column 62, but the first groove 64 may be provided in part of the circumferential outer side or may be provided in the entirety of the circumferential outer side of the first column 62, The conductive adhesive 5 such as solder may be provided on a circumferential inner side of the first groove 64 on a surface on one side of the first head 61, and the second electronic element 23 may be provided via the conductive adhesive 5.

Figure 5:
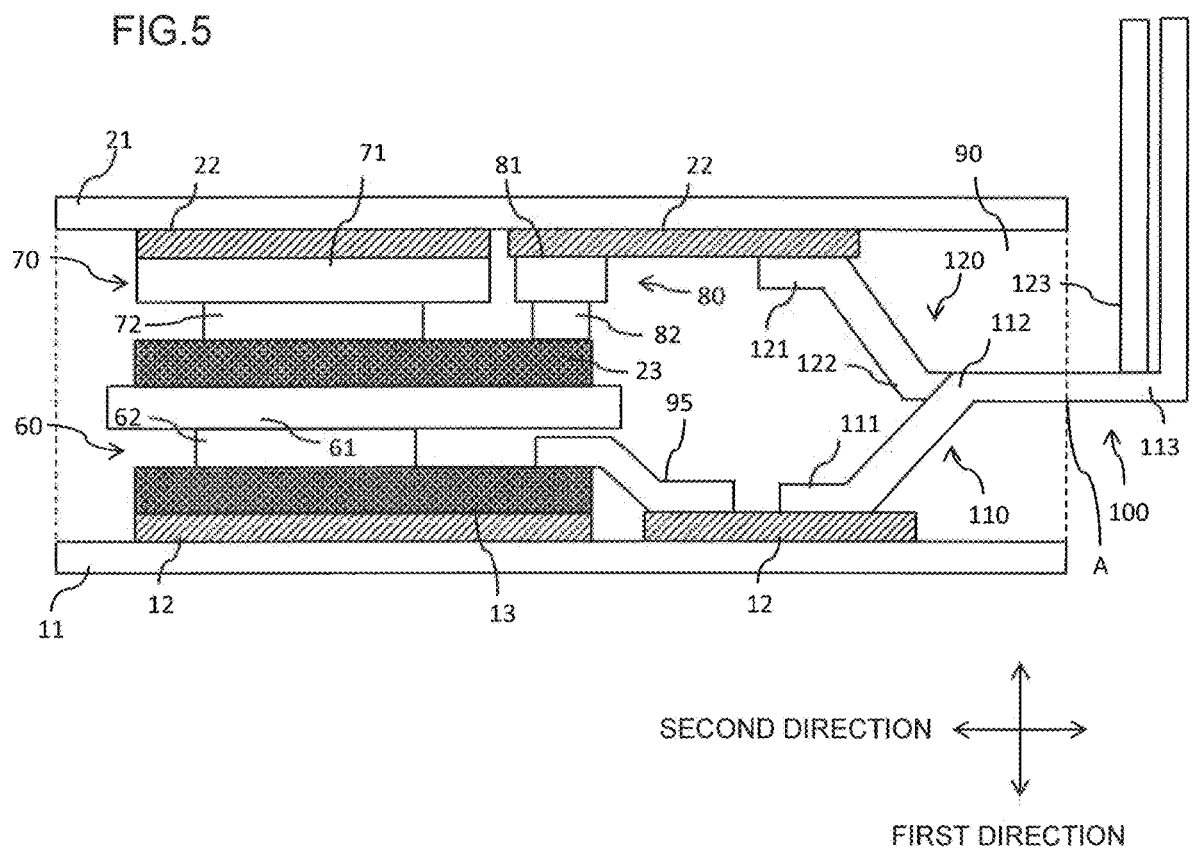
FIG. 5 is a longitudinal sectional view of another example of the electronic module that may be used in the first embodiment of the present invention.

As illustrated in FIG. 1, a connector 85 may be used that is connected to a terminal such as the second gate terminal 23g described later of the second electronic element 23, The present invention is not limited to the aspect described above, and the third connection body 80 illustrated in FIG. 5 may be used. The third connection body 80 may have a third head 81 and a third column 82 that extends toward the other side from the third head 81, The third connection body 80 may be connected to a surface on the other side of the second conductor layer 22 and a surface on one side of the second electronic element 23 via the conductive adhesive 5 such as solder.

As illustrated in FIG. 2, an aspect may be employed in which the first electronic element 13 is exposed in an outward direction from the first head 61 in the plan view. When the first electronic element 13 is a switching element such as a MOSFET, a first gate terminal 13g and the like may be provided in a part that is exposed from an outer side. Similarly, when the second electronic element 23 is a switching element such as a MOSFET, the second gate terminal 23g and the like may be provided on a surface on the other side. The first electronic element 13 illustrated in FIG. 2 has the first gate terminal 13g and a first source terminal 13s on a surface on the other side, and the second electronic element 23 has the second gate terminal 23g and a second source terminal 23s on the surface on the other side. In this case, the second connection body 70 may be connected to the second source terminal 23s of the second electronic element 23 via the conductive adhesive 5, and the connector 85 may be connected to the second gate terminal 23g of the second electronic element 23 via the conductive adhesive 5. The first connection body 60 may connect the first source terminal 13s of the first electronic element 13 and a second drain terminal provided on the other side of the second electronic element 23 via the conductive adhesive A first drain terminal provided on the other side of the first electronic element 13 may be connected to the first conductor layer 12 via the conductive adhesive 5. The first gate terminal 13g of the first electronic element 13 may be connected to a connector 95 (see FIG. 1) via the conductive adhesive 5, and the connector 95 may be connected to the first conductor layer 12 via the conductive adhesive 5.

When either of the first electronic element 13 or the second electronic element 23 is a switching element, it is conceivable that a control element having a low heat generation property is used as the second electronic element 23 placed on the first connection body 60 and a switching element is used as the first electronic element 13. Alternatively, it is conceivable that a switching element is used as the second electronic element 23 placed on the first connection body 60 and a control element having a low heat generation property is used as the first electronic element 13.

When the terminal part 100 is joined with the conductor layers 12 and 22, an aspect in which the conductive adhesive 5 such as solder is used does not always need to be employed. Laser welding may be used, or ultrasonic joining may be used.

Figure 7:
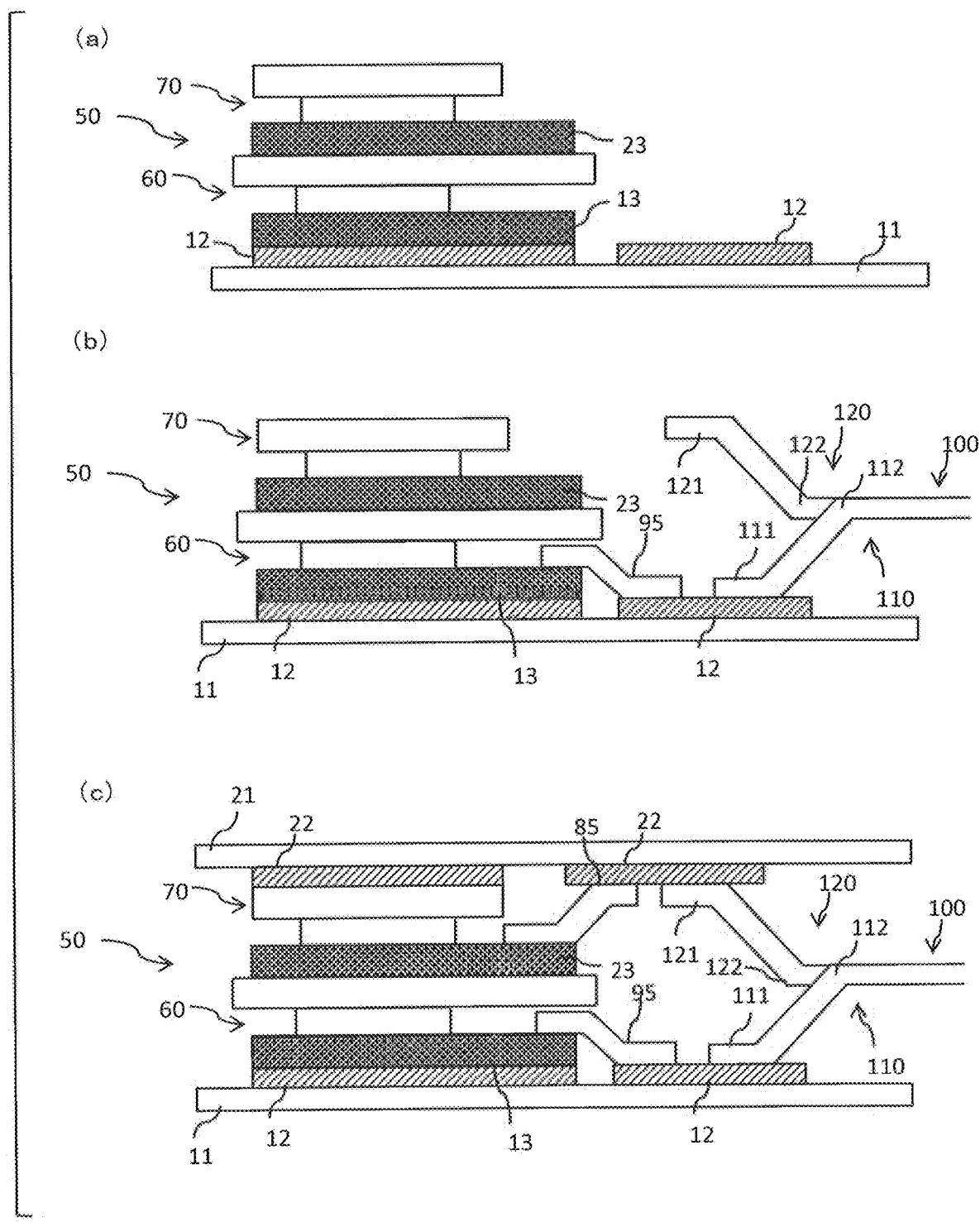
FIGS. 7(*a*) to 7(*c*) are longitudinal sectional views illustrating a manufacturing process of the electronic module that may be used in the first embodiment of the present invention.

In addition, a chip module 50 may be configured by the first electronic element 13, the second electronic element 23, the first connection body 60, the second connection body 70, the connector 85 (or the third connection body 80), and the connector 95 (see FIG. 7). In this case, an electronic module may be manufactured by disposing the chip module 50 having the first electronic element 13, the second electronic element 23, the first connection body 60, the second connection body 70, the connector 85 (or the third connection body 80), and the connector 95 between the first substrate 11 having the first conductor layer 12 and the second substrate 21 having the second conductor layer 22 and by sealing the chip module 50 using the sealing part 90.

Manufacturing Method

Next, an example of a manufacturing method for the electronic module according to this embodiment is described.

Figure 6:
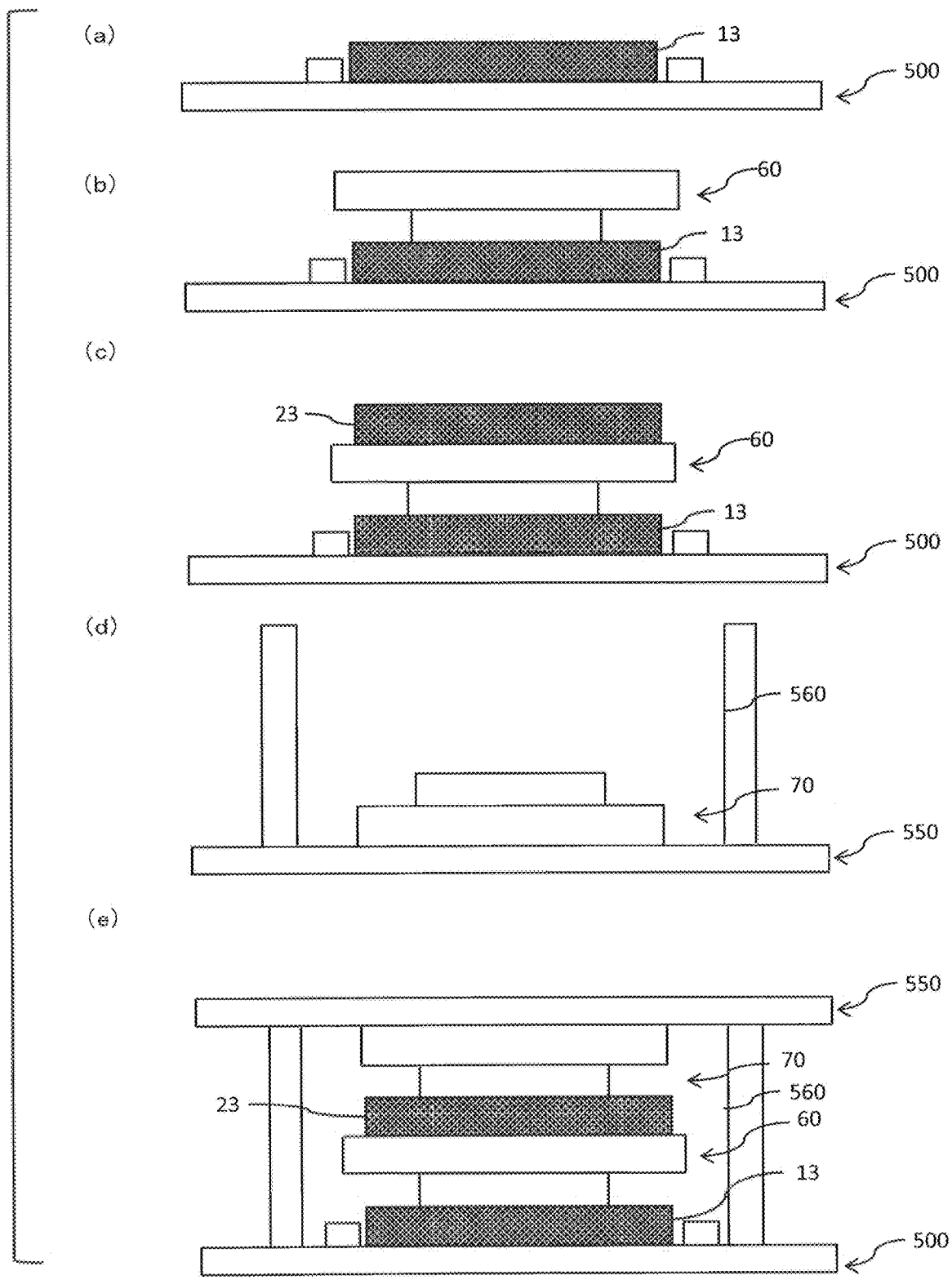
FIGS. 6(*a*) to 6(*e*) are longitudinal sectional views illustrating a manufacturing process of a chip module that may be used in the first embodiment of the present invention.

First, the first electronic element 13 is disposed on a first jig 500 (a first electronic element disposing step; see FIG. 6(a)). FIG. 6 illustrates a longitudinal cross section that is different from the longitudinal cross section of FIG. 1, and the terminal part 100 and the like are not illustrated.

Next, the first connection body 60 is disposed on the first electronic element 13 via the conductive adhesive 5 such as solder (a first connection body disposing step; see FIG. 6(b)). The conductive adhesive 5 such as solder is not illustrated in FIG. 6.

Then, the second electronic element 23 is disposed on the first connection body 60 via the conductive adhesive 5 (a second electronic element disposing step; see FIG. 6(c)). The conductive adhesive 5 on the first connection body 60 is disposed on a circumferential inner side of the first groove 64 of the first electronic element 13.

The second connection body 70 disposed on a second jig 550 (a second electronic element disposing step; see FIG. 6(d)). The second jig 550 may have a plurality of jig recess parts 560 in a position in which the second connection body 70 is disposed. The height of each of the plurality of jig recess parts 560 may correspond to the height of the chip module. That the height of each of the plurality of jig recess parts 560 corresponds to the height of the chip module means that each of the plurality of jig recess parts 560 has a height that is greater than or equal to a thickness in design of the entirety of the chip module in consideration of the thickness of the conductive adhesive 5.

The second jig 550 is reversed in a state in which the second connection body 70 is sucked onto the second jig 550 by using a suction member or the like, and the second connection body 70 is disposed on the second electronic element 23 via the conductive adhesive 5 (a reversely placing step; see FIG. 6(e)).

Then, the conductive adhesive 5 is heated to be melted, and is cured (is reflowed) (a first curing step). By doing this, the chip module 50 having the first electronic element 13 and the second electronic element 23 is manufactured.

Next, a method for manufacturing an electronic module using the chip module 50 is described.

The first electronic element 13 of the chip module 50 is disposed on the first conductor layer 12 that is Provided on the first substrate 11, via the conductive adhesive 5 (a chip module placing step; see FIG. 7(a)). In FIG. 7, similarly, the conductive adhesive 5 such as solder is not illustrated.

The connector 95 is disposed on one side of the first electronic element 13 and the first conductor layer 12 via the conductive adhesive 5. The lead frame 130 is positioned in such a way that the first terminal base end part 111 is provided on the first conductor layer 12 via the conductive adhesive 5. At this time, a jig that positions the lead frame 130 and the like may be used (a lead frame disposing step; see FIG. 7(b)).

The second conductor layer 22 provided on the second substrate 21 is positioned so as to abut onto the second connection body 70 of the chip module 50 via the conductive adhesive 5 (a second substrate disposing step; see FIG. 7(c)). At this time, the second terminal base end part 121 abuts onto the second conductor layer 22 via the conductive adhesive 5. The second substrate 21 may be disposed in a state in which the connector 85 is fixed to the second conductor layer 22 by using the conductive adhesive 5. Unless otherwise specified, "abutting" in the present invention includes an aspect of indirectly abutting in addition to an aspect of directly abutting. Examples of the aspect of indirectly abutting include an aspect of abutting via the conductive adhesive 5 such as solder.

Next, the conductive adhesive 5 is heated to be melted, and is cured (is reflowed) (a second curing step). The material of the conductive adhesive 5 to be used in this step may be the same as the material of the conductive adhesive 5 to be used in manufacturing the chip module. Unlike the aspect described above, the melting point of the conductive adhesive 5 to be used in this step may be lower than the melting point of the conductive adhesive 5 to be used in manufacturing the chip module, and in the second curing step, the conductive adhesive 5 may be heated at a temperature lower than the melting point of the conductive adhesive 5 to be used in manufacturing the chip module.

The sealing resin is injected between the first substrate 11 and the second substrate 21, or is injected so as to cover the first substrate 11 and the second substrate 21 (a sealing step).

The coupling body 131 of the lead frame 130 is cut off (a cutting-off step). In a case where the end side of the lead frame 130 is bent, the end side of the lead frame 130 may be bent before or after the coupling body 131 is cut off.

By doing as described above, the electronic module according to this embodiment is manufactured.

Operation/Effect

An example of an operation and effect of this embodiment configured as described above is described next. All of the aspects described in the "Operation/Effect" can be employed in the configuration described above.

When an aspect which the second electronic element 23 is provided on one side of the first electronic element 13 is employed in order to reduce the size of the electronic module, the number of electronic elements increases, Therefore, when a circuit pattern using the conductor layer 12 or 22 is only formed in the first substrate 11 or the second substrate 21, a size in the planar direction increases. When an aspect is employed in which the first terminal part 110 has the first bending part 112 and the first terminal base end part 111 connected to the first conductor layer 12 and the second terminal part 120 has the second bending part 122 and the second terminal base end part 121 connected to the second conductor layer 22, both the first conductor layer 12 provided on the first substrate 11 and the second conductor layer 22 provided on the second substrate 21 can be used, Consequently, a circuit pattern can be formed using both the first substrate 11 and the second substrate 21, a size in the planar direction can be prevented from increasing, and a warp or a distortion can be prevented from being generated in the first substrate 11 and the second substrate 21.

When an, aspect is employed in which the first terminal parts 110 and the second terminal parts 120 are attached by using the lead frame 130 illustrated in FIGS. 3 and 4, the first terminal parts 110 and the second terminal parts 120 can generate repulsive force in the first direction in steps until the coupling body 131 is cut off. The first substrate 11 and the second substrate 21 may be warped or distorted due to heating in a manufacturing process. The first substrate 11 and the second substrate 21 may be warped or distorted due to heating, for example, in a soldering process or a reflow process. When the lead frame 130 illustrated in FIGS. 3 and 4 is used, a force by which the first substrate 11 presses the first terminal base end parts 111 of the first terminal parts 110 toward one side is transmitted via the coupling body 131 to the second terminal base end parts 121 of the second terminal parts 120 and the second substrate 21, and a force by which the second substrate 21 presses the second terminal base end parts 121 of the second terminal parts 120 toward the other side is transmitted via the coupling body 131 to the first terminal base end parts 111 of the first terminal parts 110 and the first substrate 11. Consequently, repulsive forces can prevent the first substrate 11 and the second substrate 21 from being warped or distorted. As the first substrate 11 and the second substrate 21 increase in size in the planar direction, the warp and the distortion described above increase. In this case, the use of the lead frame 130 illustrated in FIGS. 3 and 4 offers a great advantage.

In general, the coupling body 131 of the lead frame 130 is cut off after the lead frame 130 is positioned with respect to the substrates 11 and 21 and is connected to the substrates 11 and 21 such that each of the lead frames 130 does not need to be positioned. Therefore, in a case where the first terminal base end part 111 connected to the first conductor layer 12, the first terminal outer part 113, the first bending part 112 provided between the first terminal base end part 111 and the first terminal outer part 113, the second terminal base end part 121 connected to the second conductor layer 22, the second terminal outer part 123, and the second bending part 122 provided between the second terminal base end part 121 and the second terminal outer part 123 are provided, the lead frame 130 illustrated in FIGS. 3 and 4 is highly likely to be employed.

In a case where the lead frame 130 described above is used, when the first terminal base end part 111 has a linear shape that extends in the planar direction, there is an advantage wherein a force applied from the first substrate 11 is easily transmitted to the second substrate 21. Similarly, when the second terminal base end part 121 has a linear shape that extends in the planar direction, there is an advantage wherein a force applied from the second substrate 21 is easily transmitted to the first substrate 11.

In a case where the lead frame 130 described above is used, when a distance in the thickness direction between the first terminal outer part 113 and the first substrate 11 corresponds to a distance in the thickness direction between the second terminal outer part 123 and the second substrate 21 at the boundary A between the sealing part 90 and the outside, an aspect in which a force applied due to the warp or distortion of the first substrate 11 is transmitted to the second substrate 21 via the first terminal part 110, the coupling body 131, and the second terminal part 120 can be made similar to an aspect in which a force applied due to the warp or distortion of the second substrate 21 is transmitted to the first substrate 11 via the second terminal part 120, the coupling body 131, and the first terminal part 110. This offers an advantage wherein forces applied when the first substrate 11 and the second substrate 21 are warped or distorted similarly to each other can be efficiently cancelled.

When an aspect is employed in which every prescribed number (1 to 4) of the first terminal parts 110 and every prescribed number (1 to 4) of the second terminal parts 120 are disposed in such a way that the first terminal parts 110 are nested into the second terminal parts 120, as illustrated on another side of the lead frame 130 in FIG. 4 (on a right-hand side in FIG. 4), there is an advantage wherein a force in the first direction can be uniformly applied in the planar direction.

In a case where the lead frame 130 described above is used, also when an aspect is employed in which, at the boundary A between the sealing part 90 and the outside, a distance in the thickness direction between the first terminal outer part 113 and the first substrate 11 corresponds to a distance in the thickness direction between the first terminal outer part 113 and the second substrate 21, a distance in the thickness direction between the second terminal outer part 123 and the first substrate 11 corresponds to a distance in the thickness direction between the second terminal outer part 123 and the second substrate 21, and the first terminal outer part 113 and the second terminal outer part 123 are positioned in an almost intermediate position in the thickness direction (the first direction), an aspect in which a force applied due to the warp or distortion of the first substrate 11 is transmitted to the second substrate 21 via the first terminal part 110, the coupling body 131, and the second terminal part 120 can be made similar to an aspect in which a force applied due to the warp or distortion of the second substrate 21 is transmitted to the first substrate 11 via the second terminal part 120, the coupling body 131, and the first terminal part 110. This offers an advantage wherein forces applied when the first substrate 11 and the second substrate 21 are warped or distorted similarly to each other can be efficiently cancelled.

Note that, when the distance in the thickness direction between the first terminal outer part 113 and the first substrate 11 corresponds to the distance in the thickness direction between the second terminal outer part 123 and the second substrate 21 at the boundary A between the sealing part 90 and the outside but when the coupling body 131 does not extend in the planar direction (for example, when the coupling body 131 has a step shape), the first terminal outer part 113 and the second terminal outer part 123 are not positioned in the almost intermediate position in the thickness direction (the first direction).

In an electronic module in which the first electronic element 13 and the second electronic element 23 are stacked, as described in this embodiment, it is conceivable that both surfaces are cooled down by heat sinks. When an aspect is employed in which the first terminal outer part 113 and the second terminal outer part 123 are positioned in the almost intermediate position in the thickness direction (the first direction), as described above, distances in the first direction from the respective heat sinks can become equal to each other. For safety standards, as an example, when an electronic element uses a voltage of 600 V, it is requested that a distance between a part (an alter lead) that is located outside the sealing part 90 of the terminal part 100 and each of the heat sinks be greater than or equal to 3.6 mm, Therefore, there is an advantage wherein the thickness of the electronic module can be reduced to the minimum by making a distance in the first direction between a heat sink provided on the other side and the terminal part 100 (the outer lead) that is located outside the sealing part 90 equal to a distance in the first direction between a heat sink provided on one side and the terminal part 100 (the outer lead) that is located outside the sealing part 90.

Second Embodiment

A second embodiment of the present invention is described next.

Figure 8:
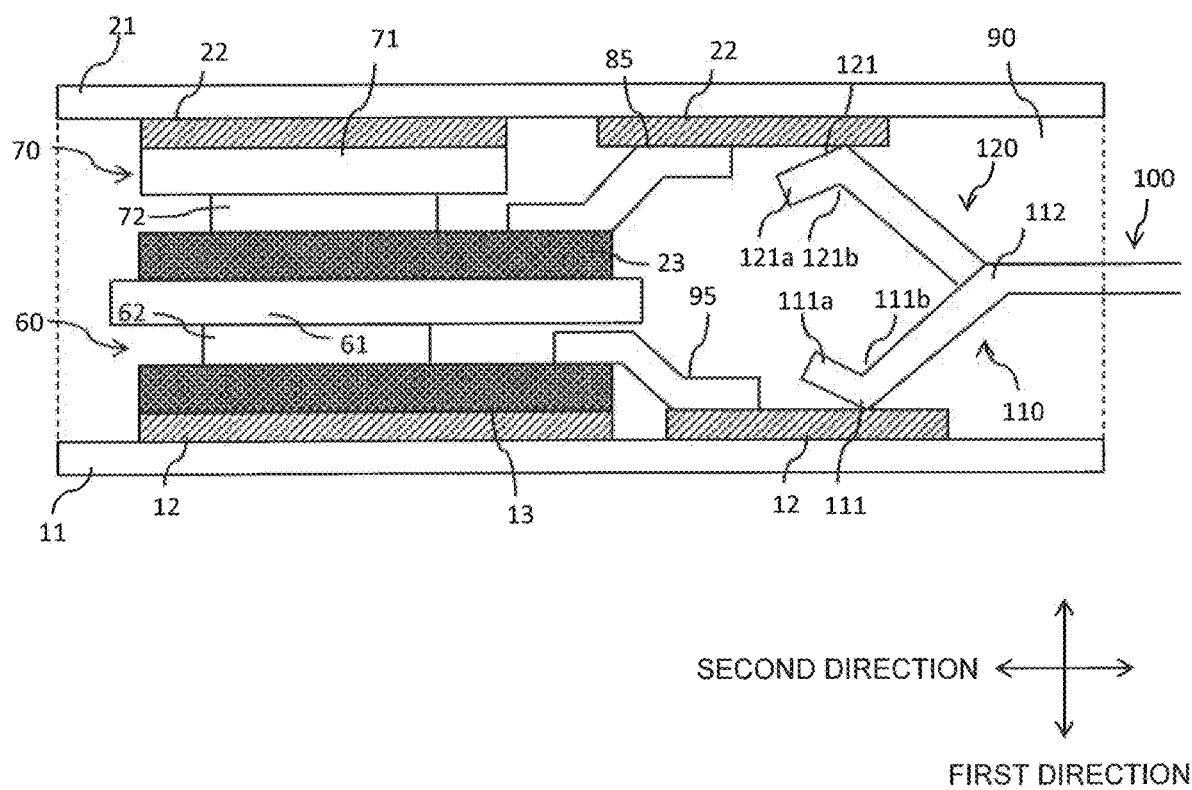
FIG. 8 is a longitudinal sectional view of an electronic module that may be used in a second embodiment of the present invention.

In the first embodiment, an aspect is employed in which the first terminal base end part 111 has a linear shape that extends in the planar direction and the second terminal base end, part 121 has a linear shape that extends in the planar direction. In this embodiment, an aspect is employed in which the first terminal base end part 111 has a first separated part 111a separated from the first conductor layer 12, a distance from the first substrate 11 in the thickness direction (the first direction) of which increases on a side of a base end part, and the second terminal base end part 121 has a second separated part 121a separated from the second conductor layer 22, a distance from the second substrate 21 in the thickness direction (the first direction) of which increases on a side of a base end part, as illustrated in FIGS. 8 and 9, More specifically, an aspect is employed in which the first terminal base end part 111 has a first bent part 111b, the first separated part 111a is formed on a side of a base end part (on a left-hand side in FIGS. 8 and 9) of the first bent part 111b, the second terminal base end part 121 has a second bent part 121b, and the second separated part 121a is formed on a side of a base end part (on a left-hand side in FIGS. 8 and 9) of the second bent part 121b. The other configuration is similar to a configuration in the first embodiment, and all of the aspects described in the first embodiment can be employed. The members described in the first embodiment are described using the same reference signs.

When an aspect is employed in which the first terminal base end part 111 has the first bent part 111b and the first separated part 111a is formed on the side of the base end part of the first bent part 111b, the conductive adhesive 5 provided between the first conductor layer 12 and the first terminal base end part 111 can have enough thickness in a circumferential part, and a crack and the like can be prevented from being generated in the conductive adhesive 5. In particular, the formation of the first separated part 111a on the side of the base end part of the first bent part 111b offers an advantage wherein the thickness of the conductive adhesive 5 can be increased in a circumferential part that is likely to deteriorate rapidly such that a crack is generated. Similarly, when an aspect is employed in which the second terminal base end part 121 has the second bent part 121b and the second separated part 121a is formed on the side of the base end part of the second bent part 121b, the conductive adhesive 5 provided between the second conductor layer 22 and the second terminal base end part 121 can have enough thickness in a circumferential part, and a crack and the like can be prevented from being generated in the conductive adhesive 5. In particular, the formation of the second separated part 121a on the side of the base end part of the second bent part 121b offers an advantage wherein the thickness of the conductive adhesive 5 can be increased in a circumferential part that is likely to deteriorate rapidly such that a crack is generated.

In addition, by providing the separated parts 111a and 121a, it can also be expected that adhesion between the terminal part 100 and the sealing part 90 such as a sealing resin will be improved.

Various shapes can be employed as the shapes of the first bent part 111b and the second bent part 121b, As an example, an aspect may be employed in which the first bent part 111b and the second bent part 121b have an angular shape that has a corner, as illustrated in FIG. 8, in a longitudinal cross section (on a plane including the first direction and the second direction), or an aspect may be employed in which the first bent part 111b and the second bent part 121b have an arc shape, as illustrated in FIG. 9.

When an aspect is employed in which the first bent part 111b has an angular shape, as illustrated in FIG. 8, there is an advantage wherein the first bent part 111b can only be formed by bending the first terminal base end part 111 and a space in the first direction can be easily generated between the first conductor layer 12 and the first terminal base end part 111. Similarly, when an aspect is employed in which the second bent part 121b has an angular shape, there is an advantage wherein the second bent part 121b can only be formed by bending the second terminal base end part 121 and a space in the first direction can be easily generated between the second conductor layer 22 and the second terminal base end part 121.

In a case where an electronic module is manufactured by employing the lead frame 130 described in the first embodiment, when an aspect is employed in which the first bent part 111b has an angular shape, there is an advantage wherein it can be expected that, when force is applied in the first direction, the first bent part 111b having an angular shape will bite into the first conductor layer 12 and repulsive force will be applied from a bitten part and its circumferential part. Similarly, in a case where an electronic module is manufactured by employing the lead frame 130 described in the first embodiment, when an aspect is employed in which the second bent part 121b has an angular shape, there is an advantage wherein it can be expected that, when force is applied in the first direction the second bent part 121b having an angular shape will bite into the second conductor layer 22 and repulsive force will be applied from a bitten part and its circumferential part.

When an aspect is employed in which the first bent part 111b has an arc shape, as illustrated in FIG. 9, the first terminal base end part 111 can be gradually separated from the first conductor layer 12, and this is advantageous when it is requested that the thickness of the conductive adhesive 5 provided on the first conductor layer 12 gradually change. Similarly, when an aspect is employed in which the second bent part 121b has an arc shape, the second terminal base end part 121 can be gradually separated from the second conductor layer 22, and this is advantageous when it is requested that the thickness of the conductive adhesive 5 provided on the second conductor layer 22 gradually change.

In a case where an electronic module is manufactured by employing the lead frame 130 described in the first embodiment, when an aspect is employed in which the first bent part 111b has an arc shape, there is an advantage wherein it can be expected that, when force is applied in the first direction, repulsive force will be applied due to the elastic force of the first bent part 111b having an arc shape. Similarly, in a case where an electronic module is manufactured by employing the lead frame 130 described in the first embodiment, when an aspect is employed in which the second bent part 121b has an arc shape, there is an advantage wherein it can be expected that, when force is applied in the first direction, repulsive force will be applied due to the elastic force of the second bent part 121b having an arc shape.

When an electronic module is manufactured by employing the lead frame 130 described in the first embodiment, it is assumed that the first terminal base end part 111 is pressed onto the first conductor layer 12. Therefore, it is difficult to provide a gap between the first terminal base end part 111 and the first conductor layer 12, However, by employing an aspect in which the first separated part 111a is provided, as described in this embodiment, a certain size of gap can be provided between the first terminal base end part 111 and the first conductor layer 12 at least on a side of the first separated part 111a, and a crack can be prevented from being generated in the conductive adhesive 5 provided on the first conductor layer 12. Similarly, when an electronic module is manufactured by employing the lead frame 130 described in the first embodiment, it is assumed that the second terminal base end part 121 is pressed onto the second conductor layer 22. Therefore, it is difficult to provide a gap between the second terminal base end part 121 and the second conductor layer 22. However, by employing an aspect in which the second separated part 121a is provided, as described in this embodiment, a certain size of gap can be provided: between the second terminal base end part 121 and the second conductor layer 22 at least on a side of the second separated part 121a, and a crack can be prevented from being generated in the conductive adhesive 5.

In particular, when an aspect is employed in which the height (the length in the first direction) of the lead frame 130 is greater than a design height (a space in the first direction) between the first substrate 11 and the second substrate 21 in order to apply a greater repulsive force against the warp or distortion of the first substrate 11 and the second substrate 21 due to heat, the terminal base end parts 111 and 121 are configured to be pressed more strongly onto the conductor layers 12 and 22. Therefore, it is difficult to provide a gap between the terminal base end parts 111 and 121 and the conductor layers 12 and 22. The employment of the separated parts 111a and 121a described in this embodiment offers an advantage wherein the thickness of the conductive adhesive 5 can be increased in a circumferential part such that reliability can be enhanced.

Tolerance exists in the thickness of the substrate 12 or 22 and the thickness of the terminal part 110. Due to the tolerance, the thickness of the conductive adhesive 5 may be excessively reduced, or a distance between the conductor layer 13 or 23 and the terminal part 110 may be excessively increased. In addition, the positions in the first direction of the substrates 11 and 13 may deviate from their appropriate positions. However, by employing the separated parts 111a and 121a described in this embodiment, even when an aspect is employed in which the terminal base end parts 111 and 121 are designed to be positioned relatively near the conductor layers 13 and 23 and parts of the terminal base end parts 111 and 121 are in direct contact with the conductor layers 13 and 23, the thickness of the conductive adhesive 5 can be increased in a circumferential part that is likely to deteriorate rapidly such that a crack is generated. This also offers an advantage wherein the problems above can be solved. Consequently, the precision of positioning in a manufacturing process can be lowered, and this offers an advantage wherein the manufacturing process is facilitated such that a manufacturing efficiency can be enhanced.

Third Embodiment

A third embodiment of the present invention is described next. In this embodiment, an aspect is employed in which the first terminal base end part 111 has a first terminal protrusion part 116 that protrudes on a side of the first substrate 11 and the second terminal base end part 121 has a second terminal protrusion part 126 that protrudes on a side of the second substrate 21, as illustrated in FIG. 10. In the other configuration, all of the aspects described in each of the embodiments above can be employed. The members described in each of the embodiments above are described using the same reference signs.

When an aspect is employed in which the first terminal base end part 111 has the first terminal protrusion part 116, the conductive adhesive 5 provided between the first conductor layer 12 and the first terminal base end part 111 can have enough thickness, and a crack and the like can be prevented from being generated in the conductive adhesive 5. Similarly, when an aspect is employed in which the second terminal base end part 121 has the second terminal protrusion part 126, the conductive adhesive 5 provided between the second conductor layer 22 and the second terminal base end part 121 can have enough thickness, and crack and the like can be prevented from being generated in the conductive adhesive 5.

When an electronic module is manufactured by employing the lead frame 130 described in the first embodiment, it is assumed that the first terminal base end part 111 is pressed onto the first conductor layer 12. Therefore, it is difficult to provide a gap between the first terminal base end part 111 and the first conductor layer 12. However, by employing an aspect in which the first terminal protrusion part 116 is provided, as described in this embodiment, a certain size of gap can be provided between the first terminal base end part 111 and the first conductor layer 12 in a circumferential part, and a crack can be prevented from being generated in the conductive adhesive 5 provided on the first conductor layer 12. Similarly, when an electronic module is manufactured by employing the lead frame 130 described in the first embodiment, it is assumed that the second terminal base end part 121 is pressed onto the second conductor layer 22, Therefore, it is difficult to provide a gap between the second terminal base end part 121 and the second conductor layer 22, However, by employing an aspect in which the second terminal protrusion part 126 is provided, as described in this embodiment, a certain size of gap can be provided between the second terminal base end part 121 and the second conductor layer 22 in a circumferential part, and a crack can be prevented from being generated in the conductive adhesive 5.

In particular, when an aspect is employed in which the height (the length in the first direction) of the lead frame 130 is greater than a design height (a space in the first direction) between the first substrate 11 and the second substrate 21 in order to apply a greater repulsive force against the warp or distortion of the first substrate 11 and the second substrate 21 due to heat, the terminal base end parts 111 and 121 are configured to be pressed more strongly onto the conductor layers 12 and 22. Therefore, it is difficult to provide a gap between the terminal base end parts 111 and 121 and the conductor layers 12 and 22. The employment of the terminal protrusion parts 116 and 126 described in this embodiment offers an advantage wherein the thickness of the conductive adhesive 5 can be increased in a circumferential part such that reliability can be enhanced.

In addition, by providing the first terminal protrusion part 116 and the second terminal protrusion part 126, it can also be expected that adhesion between the terminal part 100 and the sealing part 90 such as a sealing resin will be improved, Various shapes can be employed as the shapes of the first terminal protrusion part 116 and the second terminal protrusion part 126. The longitudinal cross sections of the first terminal protrusion part 116 and the second terminal protrusion part 126 may have a semispherical shape or an arc shape, as illustrated in FIG. 10(a), or may have a trapezoidal shape, as illustrated in FIG. 10(b). The present invention is not limited to this, and the longitudinal cross sections of the first terminal protrusion part 116 and the second terminal protrusion part 126 may have a rectangular shape or a triangular shape.

One first terminal protrusion part 116 and one second terminal protrusion part 126 do not always need to be provided, and a plurality of first terminal protrusion parts 116 and a plurality of second terminal protrusion parts 126 may be provided. Considering that the thickness of the conductive adhesive 5 is increased in a circumferential part that is likely to deteriorate rapidly such that a crack is generated, it is beneficial that the terminal protrusion parts 116 and 126 are provided in a part other than the circumferential parts of the terminal base end parts 111 and 121.

There is also an advantage wherein each of the first terminal protrusion part 116 and the second terminal protrusion part 126 can be easily formed, for example, by striking the terminal base end parts 111 and 121 having a flat shape.

Fourth Embodiment

A fourth embodiment of the present invention is described next.

Figure 11:
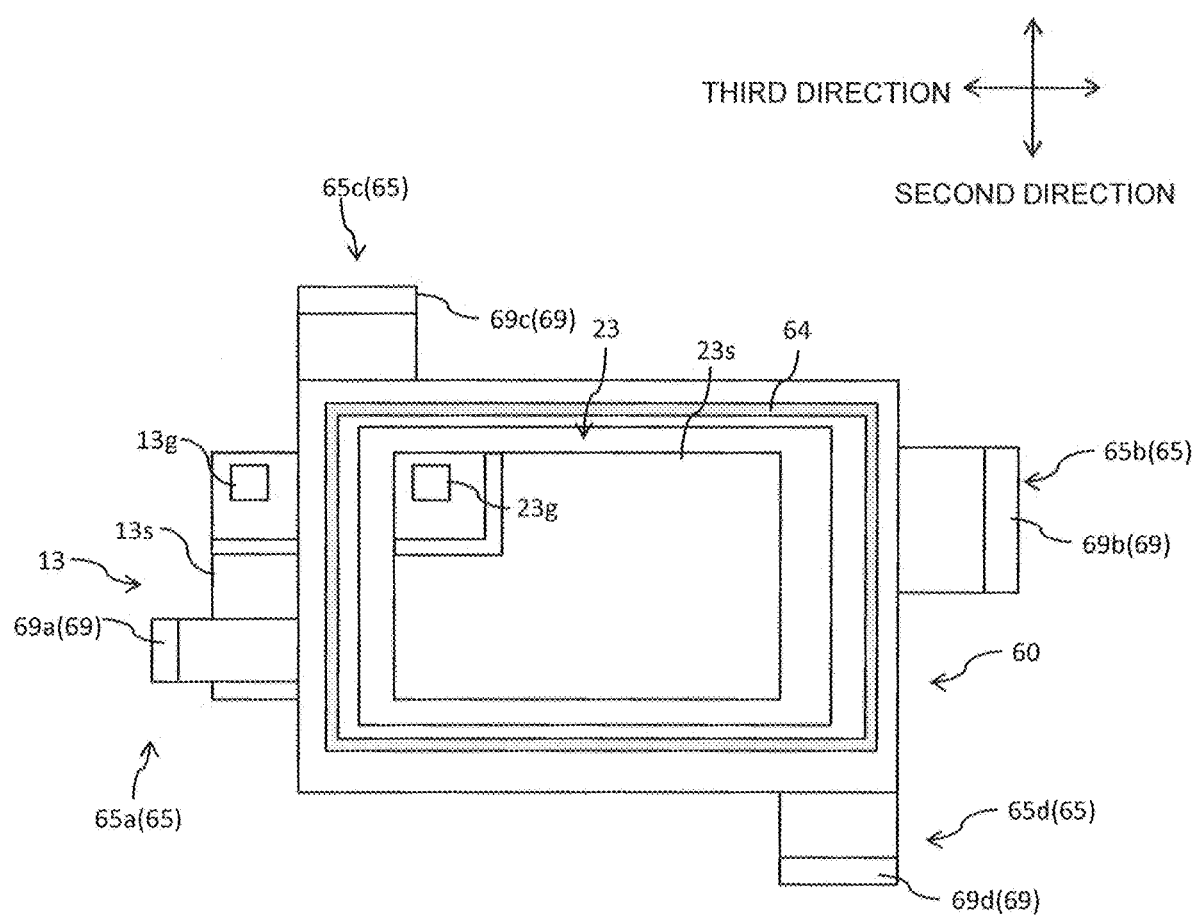
FIG. 11 is a plan view of an electronic module that may be used in a fourth embodiment of the present invention.

In each of the embodiments described above, the first connection body 60 having a substantially T-shaped cross section is used. In contrast, a first connection body 60 according to this embodiment has four supporting parts 65 (65a to 65d) that extend toward the other side from the first head 61, as illustrated in FIG. 11. The supporting parts 65 are configured to abut onto the first conductor layer 12 or the first substrate 11. In the other configuration, all of the aspects described in each of the embodiments above can be employed. The members described in each of the embodiments above are described using the same reference signs.

This embodiment is described using an aspect in which the four supporting parts 65 are utilized. However, the present invention is not limited to this, and one supporting part 65, two supporting parts 65, three supporting parts 65, or five or move supporting parts 65 may be utilized.

When the supporting parts 65 that extend from the first head 61 are provided, as described in this embodiment, the first connection body 60 can be prevented from being inclined due to the weight of the second electronic element 23 when the second electronic element 23 is mounted or after the second electronic element 23 is mounted. In addition, the supporting parts 65 abut onto the first substrate 11 or the first conductor layer 12 such that heat dissipation can be enhanced. In particular, when the supporting parts 65 abut onto the first conductor layer 12, there is an advantage wherein a heat dissipation effect can be further enhanced.

When a plurality of supporting parts 65 are provided, as described in this embodiment, there is an advantage wherein the first connection body 60 can be stably provided and a high heat dissipation effect can be achieved.

Each of the supporting parts 65 may have a supporting base end part 69 (69a to 69d) that extends in the planar direction and that abuts onto the first substrate 11 or the first conductor layer 12. Not all of the plurality of supporting parts 65 needs to be provided with the supporting base end part 69. Some; of the plurality of supporting parts 65 may be provided with the supporting base end part 69, and the supporting base end part 69 may be omitted from the other supporting parts 65.

When the supporting base end parts 69 described above are provided, the first connection body 60 can be disposed on the first substrate 11 or the first conductor layer 12 a more balanced manner, and an area where the first connection body 60 is in contact with the first substrate 11 or the first conductor layer 12 can be increased by using the supporting base end parts 69, This results in an increase in the heat dissipation effect.

Each of the supporting parts 65 may abut onto the first conductor layer 12. When an aspect is employed in which a first conductor layer 12 connected to the supporting parts 65 is not electrically connected to another first conductor layer. 12, the second conductor layer 22, the first electronic element 13, and the second electronic element 23 such that the first conductor layer 12 connected to the supporting parts 65 does not have an electrical function, there is an advantage wherein the first electronic element 13 and the second electronic element 23 can be prevented from exhibiting unexpected behavior due to the electrical connection of the supporting parts 65.

When the first connection body 60 is employed that has the plurality of supporting parts 65, as described in this embodiment, repulsive force can be applied against the warp or distortion of the first substrate 11 and the second substrate 21 due to heat, similarly to a case where the lead frame 130 described in the first embodiment is used, Stated another way, a force that warps or distorts the first substrate 11 and the second substrate 21 is applied due to heating in a process of manufacturing an electronic module, as described above. However, by using the first connection body 60 that has the plurality of supporting parts 65, there is an advantage wherein the first connection body 60, in addition to the actions of the first terminal base end part 111 and the second terminal base end part 121, can prevent the first substrate 11 and the second substrate 21 from being warped or distorted via the second electronic element 23, the second connection body 70, the third connection body 80, the connector 85, and the like.

Fifth Embodiment

A fifth embodiment of the present invention is described next.

Each of the embodiments has been described above by using the second connection body 70 that has the second column 72 and that has a substantially T-shaped cross section. In contrast, a second connection body 70 according to this embodiment has extension parts 75 (75a and 75b) that extend toward the other side from the second head 71, as illustrated in FIG. 12. In the other configuration, all of the aspects described in each of the embodiments above can be employed. The members described in each of the embodiments above are described using the same reference signs.

This embodiment is described using an aspect in which two extension parts 75 are utilized. However, the present invention is not limited to this, and one extension part 75 or three or more extension parts 75 may be utilized.

According to this embodiment, the extension parts 75 are provided, and this enables heat from the second electronic element 23 to be efficiently dissipated, and the second connection body 70 can also exhibit a high heat dissipation effect.

When a plurality of extension parts 75 are provided, as described in this embodiment, there is an advantage wherein a higher heat dissipation effect can be achieved.

Each of the extension parts 75 may abut onto the first conductor layer 12, A first conductor layer 12 connected to the extension parts 75 may not be electrically connected to another first conductor layer 12, the second conductor layer 22, the first electronic element 13, and the second electronic element 23.

When the second connection body 70 is employed that has the plurality of extension parts, as described in this embodiment, repulsive force can be applied against the warp or distortion of the first substrate 11 and the second substrate 21 due to heat, similarly to a case where the lead frame 130 described in the first embodiment is used, Stated another way, a force that warps or distorts the first substrate 11 and the second substrate 21 is applied due to heating in a process of manufacturing an electronic module, as described above. However, by using the second connection body 70 that has the plurality of extension parts, there is an advantage wherein the second connection body 70, in addition to the actions of the first terminal base end part 111 and the second terminal base end part 121, can prevent the first substrate 11 and the second substrate 21 from being warped or distorted.

Sixth Embodiment

A sixth embodiment of the present invention is described next.

Figure 13:
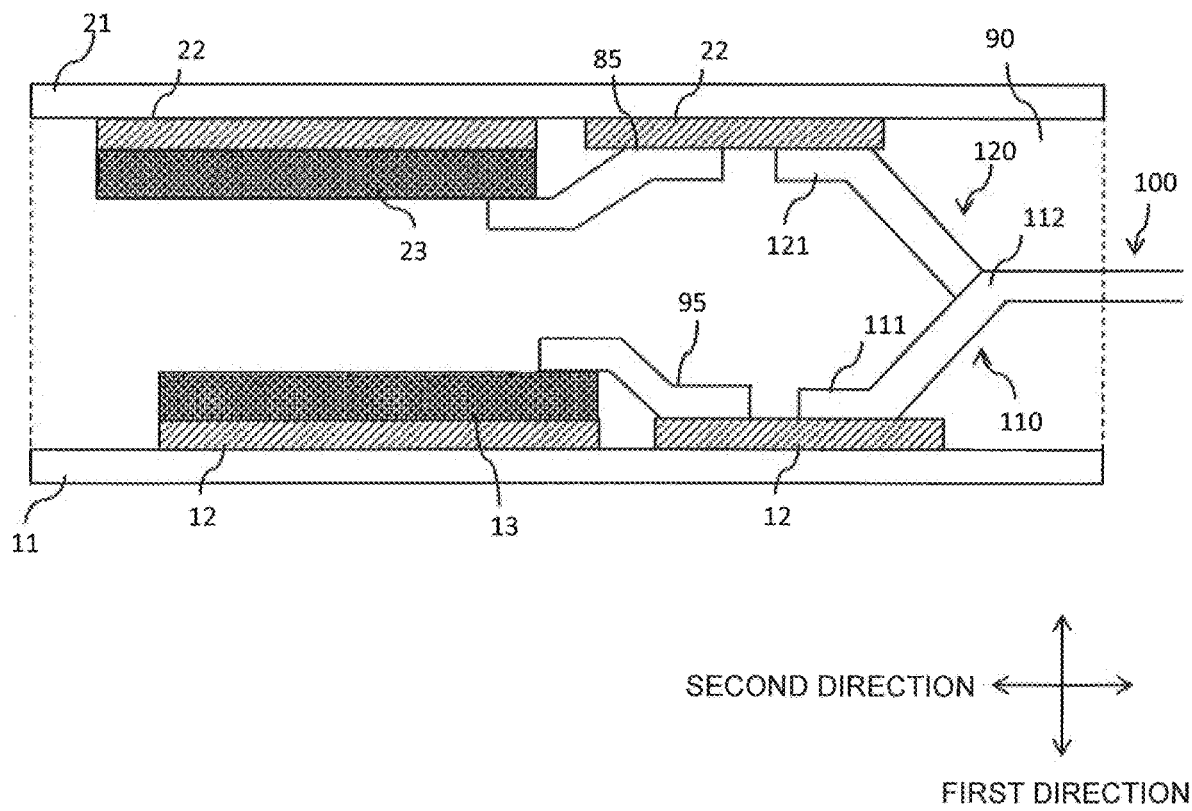
FIG. 13 is a longitudinal sectional view of an electronic module that may be used in a sixth embodiment of the present invention.

Each of the embodiments has been described above by using an aspect in which the first connection body 60 and the second connection body 70 are used. However, the present invention is not limited to this aspect. As illustrated in FIG. 13, the first connection body 60 and the second connection body 70 may be omitted. According to this embodiment, similarly, the effects described above of the terminal part 100 can be exhibited.

The description of the embodiments and the disclosure of the drawings described above are merely examples for explaining the invention described in the claims, and the invention described in the claims is not limited by the description of the embodiment or the disclosure of the drawings described above. In addition, the recitation of the claims at the original application is merely an example, and the recitation of the claims can be appropriately changed based on the description of the specification, the drawings, and the like.

REFERENCE SIGNS LIST

11 First substrate
12 First conductor layer
13 First electronic element
21 Second substrate
22 Second conductor layer
23 Second electronic element
110 First terminal part
120 Second terminal part
111 First terminal base end part
111a First separated part
111b First bent part
112 First bending part
113 First terminal outer part
116 First terminal protrusion part
121 Second terminal base end part
121a Second separated part
121b Second bent part
122 Second bending part
123 Second terminal outer part
126 Second terminal protrusion part

The invention claimed is:

1. An electronic module comprising:
a first substrate;
a first electronic element that is provided on one side of the first substrate;
a second electronic element that is provided on one side of the first electronic element;
a second substrate that is provided on one side of the second electronic element;
a first terminal part that is electrically connected to the first electronic element; and
a second terminal part that is electrically connected to the second electronic element, wherein
the first terminal part has a first terminal base end part, a first terminal outer part, and a first bending part that is provided between the first terminal base end part and the first terminal outer part and that is bent toward the other side on a side of the first terminal base end part,
the second terminal part has a second terminal base end part, a second terminal outer part, and a second bending part that is provided between the second terminal base end part and the second terminal outer part and that is bent toward one side on a side of the second terminal base end part, and
a sealing part, which seals at least the first electronic element, the second electronic element, the first terminal base end part, the first bending part, the second terminal base end part and the second bending part, is provided,
wherein at a boundary between the sealing part and an outside, a distance in a thickness direction between the first terminal outer part and the first substrate corresponds to a distance in the thickness direction between the second terminal outer part and the second substrate.

2. The electronic module according to claim 1, wherein
the first terminal base end part has a first separated part, a distance from the first substrate in the thickness direction of which increases on a side of a base end part, and
the second terminal base end part has a second separated part, a distance from the second substrate in the thickness direction of which increases on a side of a base end part.

3. The electronic module according to claim 2, wherein
the first terminal base end part has a first bent part, and the first separated part is formed on a side of a base end part of the first bent part, and
the second terminal base end part has a second bent part, and the second separated part is formed on a side of a base end part of the second bent part.

4. The electronic module according to claim 3, wherein
the first bent part has an angular shape or an arc shape in a longitudinal cross section, and
the second bent part has an angular shape or an arc shape in a longitudinal cross section.

5. The electronic module according to claim 1, wherein
the first terminal base end part has a first terminal protrusion part that protrudes on a side of the first substrate and
the second terminal base end part has a second terminal protrusion part that protrudes on a side of the second substrate.

6. An electronic module comprising:
a first substrate;
a first electronic element that is provided on one side of the first substrate;
a second electronic element that is provided on one side of the first electronic element;
a second substrate that is provided on one side of the second electronic element;
a first terminal part that is electrically connected to the first electronic element; and
a second terminal part that is electrically connected to the second electronic element, wherein
the first terminal part has a first terminal base end part, a first terminal outer part, and a first bending part that is provided between the first terminal base end part and the first terminal outer part and that is bent toward the other side on a side of the first terminal base end part,
the second terminal part has a second terminal base end part, a second terminal outer part, and a second bending part that is provided between the second terminal base end part and the second terminal outer part and that is bent toward one side on a side of the second terminal base end part, and
a sealing part, which seals at least the first electronic element, the second electronic element, the first terminal base end part, the first bending part, the second terminal base end part and the second bending part, is provided, wherein at a boundary between the sealing part and an outside, a distance in a thickness direction between the first terminal outer part and the first substrate corresponds to a distance in the thickness direction between the first terminal outer part and the second substrate, and wherein at the boundary between the sealing part and the outside, a distance in the thickness direction between the second terminal outer part and the first substrate corresponds to a distance in the thickness direction between the second terminal outer part and the second substrate.

7. The electronic module according to claim 6, wherein the first terminal base end part has a first separated part, a distance from the first substrate in the thickness direction of which increases on a side of a base end part, and the second terminal base end part has a second separated part, a distance from the second substrate in the thickness direction of which increases on a side of a base end part.

8. The electronic module according to claim 7, wherein the first terminal base end part has a first bent part, and the first separated part is formed on a side of a base end part of the first bent part, and the second terminal base end part has a second bent part, and the second separated part is formed on a side of a base end part of the second bent part.

9. The electronic module according to claim 8, wherein the first bent part has an angular shape or an arc shape in a longitudinal cross section, and the second bent part has an angular shape or an arc shape in a longitudinal cross section.

10. The electronic module according to claim 6, wherein the first terminal base end part has a first terminal protrusion part that protrudes on a side of the first substrate and the second terminal base end part has a second terminal protrusion part that protrudes on a side of the second substrate.

11. A lead frame comprising:

a first terminal part having a first terminal base end part, a first terminal outer part, and a first bending part that is provided between the first terminal base end part and the first terminal outer part and that is bent toward the other side on a side of the first terminal base end part;

a second terminal part having a second terminal base end part, a second terminal outer part, and a second bending part that is provided between the second terminal base end part and the second terminal outer part and that is bent toward one side on a side of the second terminal base end part; and a coupling body connecting between the first terminal part and the second terminal part, wherein a distance in a thickness direction from the coupling body to a surface on the other side of the first terminal base end part corresponds to a distance in the thickness direction from the coupling body to a surface on one side of the second terminal base end part.

12. A manufacturing method for an electronic module, the manufacturing method comprising:

causing the first terminal base end part of the lead frame according to claim 11 to abut onto a first conductor layer provided on a first substrate or a first substrate that is a metal substrate, and causing the second terminal base end part of the lead frame according to claim 8 to abut onto a second conductor layer provided on a second substrate or a second substrate that is a metal substrate; and cutting off the coupling body, wherein the first conductor layer or the first substrate that is the metal substrate is electrically connected to a first electronic element, and the second conductor layer or the second substrate that is the metal substrate is electrically connected to a second electronic element.

* * * * *